(12) United States Patent
Uzawa

(10) Patent No.: US 6,473,158 B2
(45) Date of Patent: *Oct. 29, 2002

(54) EXPOSURE METHOD AND EXPOSURE APPARATUS

(75) Inventor: Shigeyuki Uzawa, Tokyo (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/248,278

(22) Filed: Feb. 11, 1999

(65) Prior Publication Data

US 2001/0050761 A1 Dec. 13, 2001

(30) Foreign Application Priority Data

Feb. 13, 1998 (JP) .......................... 10-048782

(51) Int. Cl.[7] ............................................. G03B 27/42
(52) U.S. Cl. ..................................................... 355/53
(58) Field of Search ............................. 355/52, 53, 61, 355/67, 68, 71; 356/121, 375, 400, 401; 430/22, 30; 382/151

(56) References Cited

U.S. PATENT DOCUMENTS

| | | | | |
|---|---|---|---|---|
| 5,172,189 A | * | 12/1992 | Mitome | 356/401 |
| 5,742,376 A | * | 4/1998 | Makinouchi | 355/53 |
| 5,751,428 A | * | 5/1998 | Kataoka et al. | 356/401 |
| 5,854,671 A | * | 12/1998 | Nishi | 355/53 |
| 5,861,944 A | * | 1/1999 | Nishi | 355/68 |

* cited by examiner

Primary Examiner—N. Le
Assistant Examiner—Etienne P LeRoux
(74) Attorney, Agent, or Firm—Fitzpatrick, Cella, Harper & Scinto

(57) ABSTRACT

An exposure apparatus includes a light source for emitting light, an illumination system for illuminating a pattern of a first object with light from the light source, a projection system for projecting the pattern, as illuminated, onto a second object, wherein the same region on the second object to be exposed is exposed plural times through cooperation of the projection system and the illumination system and a changing device for performing the plural times exposures while changing an exposure condition.

24 Claims, 5 Drawing Sheets

MULTIPLE EXPOSURE (SCAN)

DIFFERENCE IN ILLUMINATION CONDITION
FOR RESIST PROFILE AFTER DEVELOPMENT

EXPOSURE METHOD AND EXPOSURE APPARATUS

FIELD OF THE INVENTION AND RELATED ART

This invention relates to an exposure method and an exposure apparatus for use in the manufacture of semiconductor devices or magnetic heads, for example. Particularly, the invention is directed to improvements in a shape of a resist pattern after exposure or development.

Generally, when the numerical aperture of a projection optical system is denoted by NA and the exposure wavelength used is λ, the resolution and the depth of focus can be expressed as follows:

$$\text{Resolution} = k_1 \times \lambda / NA \quad (1)$$

$$\text{Depth of Focus} = k_2 k_2 \times \lambda / NA^2 \quad (2)$$

In equations (1) and (2), $k_1$ and $k_2$ are parameters of the resist. In order to improve the resolution under a predetermined $k_1$ and $k_2$, from equation (1) it is seen that the NA should be enlarged. On the other hand, enlargement of the NA results in a decrease in the depth of focus, as seen from equation (2). Therefore, in accordance with a pattern size and shape desired, there will be an optimum NA to be selected.

This similarly applies to the selection of a value of σ of an illumination system. If, for a resist of a particular film thickness, printing is made while changing the σ of the illumination, there will be cases in which the shape of the resist is improved with a smaller σ of the illumination system and more definite perpendicular pattern shaping is attained. Which σ of the illumination system is good is similarly determined in accordance with the size and shape of the pattern desired.

Conventionally, in consideration of the above, exposure apparatuses are provided with plural values of NA and σ of the illumination system, and a particular combination of NA and σ is selected in accordance with the size and shape of the pattern desired.

SUMMARY OF THE INVENTION

It has recently been found that, to a resist of a particular type, a dual exposure procedure based on two combinations of NA and σ is effective to produce a higher image contrast. If the resist thickness is large, even for ordinary resists, there is a tendency such as described below.

FIG. 1 illustrates resist profiles after development, as formed by printing under various conditions. FIG. 1 at (a) shows the result of exposure with a moderate NA a large illumination σ, wherein the top end of the resist pattern is narrowed. FIG. 1 at (b) shows the result of exposure with a moderate NA and a small illumination σ, wherein the top end of the resist pattern is rounded, contrary to that of FIG. 1 at (a). FIG. 1 at (c) shows the result of dual exposure made with different exposure amounts under the FIG. 1 at (a) and FIG. 1 at (b) conditions, respectively. The result is a best profile, intermediate of them.

It is an object of the present invention to provide an exposure apparatus and/or an exposure method, by which exposure of the same exposure region can be performed under different illumination conditions and by use of different projection optical systems.

It is another object of the present invention to provide an exposure apparatus and/or an exposure method, by which, with an improved exposure amount control and an optimized exposure sequence for dual exposure, an improved projection exposure process is enabled.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
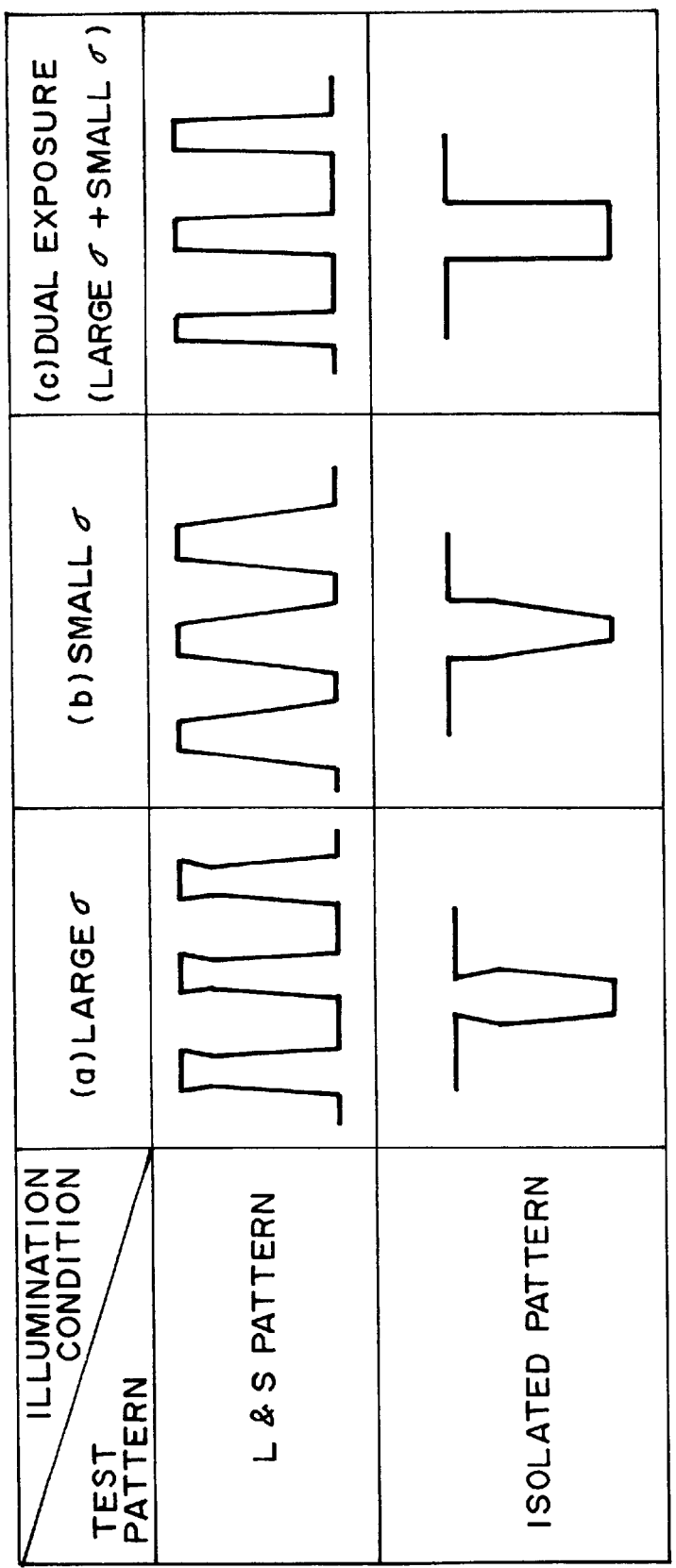
FIG. 1 is a schematic view of resist profiles, for explaining advanrageous effects of the present invention.
Figure 2:
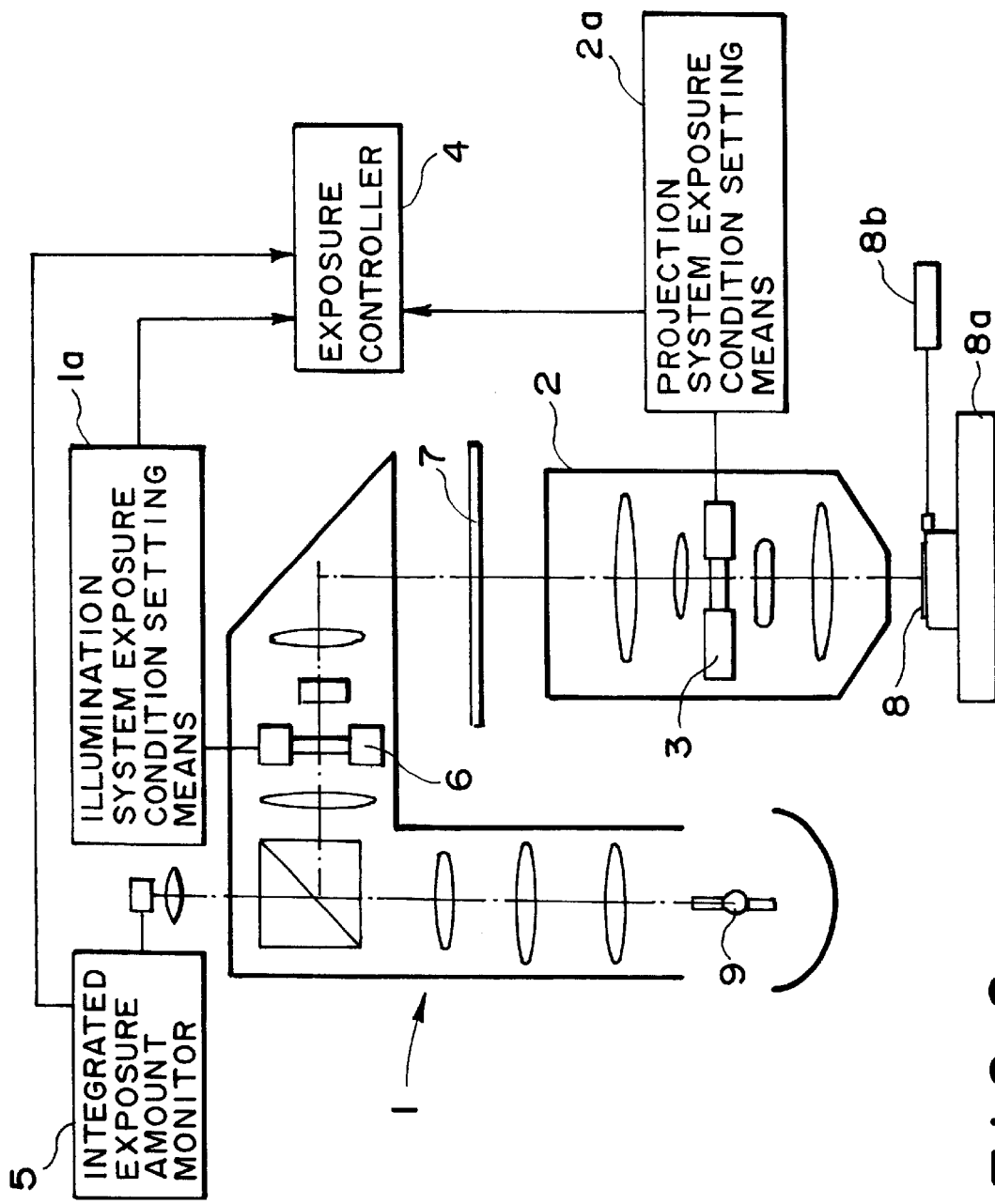
FIG. 2 is a schematic and diagrammatic view of a projection exposure apparatus according to an embodiment of the present invention.

FIG. 2 is a schematic and diagrammatic view of an exposure apparatus which embodies the present invention. The exposure apparatus may be of a stepper type or scan type, and basically it includes an illumination system and a projection system. The illumination system 1 includes illumination system exposure condition setting means 1a which is operable to actuate σ driving means 6 to control the illumination conditions in the illumination system. On the other hand, the projection system 2 includes projection system exposure condition setting means 2a which is operable to actuate aperture driving means 3 within the projection system to control the numerical aperture NA. The illumination system exposure condition setting means 1a and the projection system exposure condition setting means 2a are controlled by an exposure controller 4, for controlling the whole exposure apparatus, whereby setting conditions are controlled.

The illumination system further includes an integrated exposure amount monitor 5 for detecting the amount of exposure, by receiving a branched portion of the light of the illumination system. Denoted at 7 is a reticle, and denoted at 8 is a wafer. Denoted at 9 is a light source. Denoted at 8a is a wafer stage, and denoted at 8b is an interferometer for detecting the position of the wafer stage 8a.

The first embodiment will be described with reference to a stepper and, particularly, to an example wherein every shot is to be exposed under two different exposure conditions.

Figure 3:
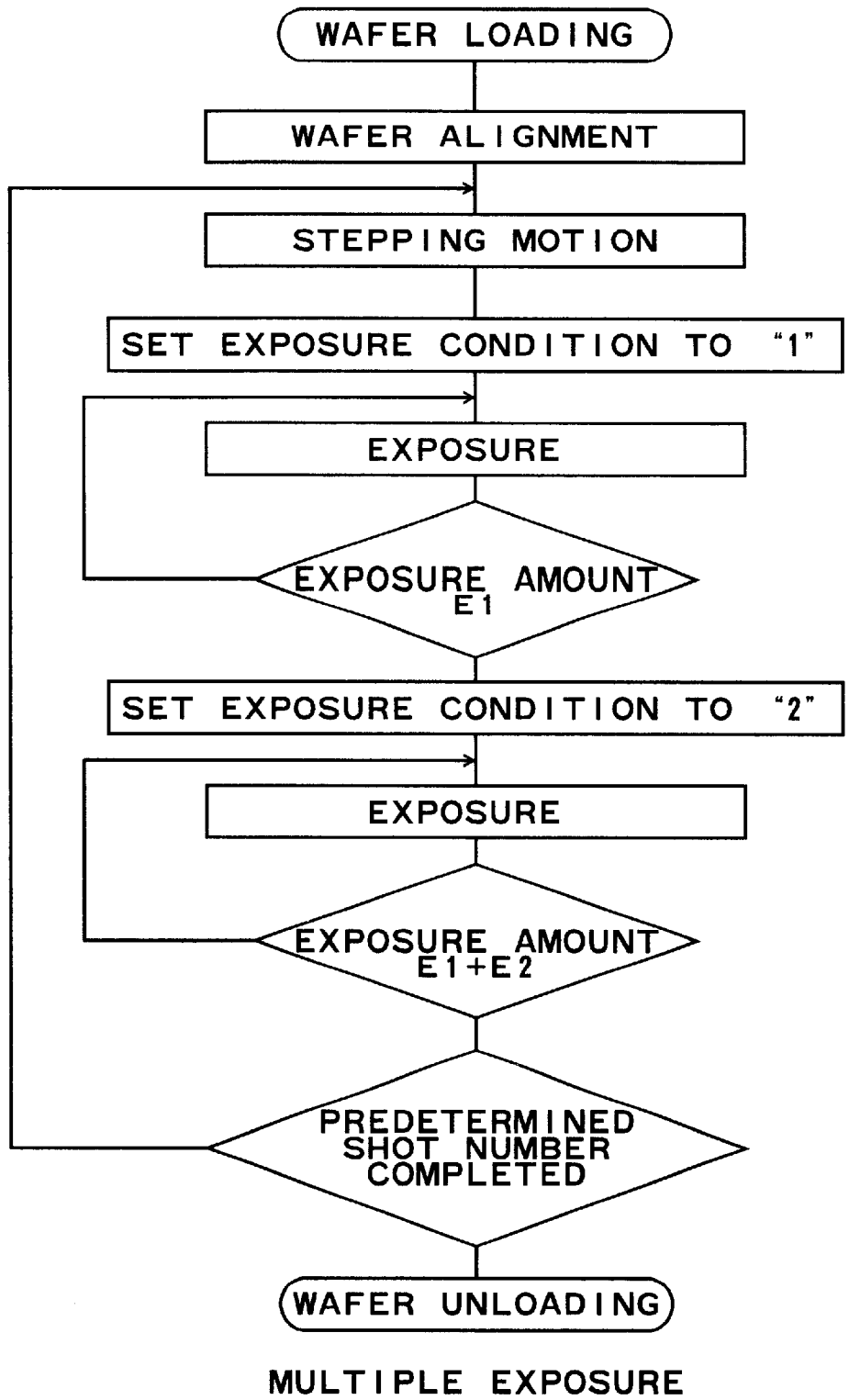
FIG. 3 is a flow chart of a multiple exposure procedure, in an example wherein the present invention is applied to a stepper.

FIG. 3 is a flow chart according to this embodiment. In a stepper, a wafer is loaded onto a wafer stage and, thereafter, wafer alignment is performed to align the wafer with respect to a reticle. Generally, a wafer has plural shots (exposure regions) defined thereon. After measurement of positions related to the shot layout, the shots are exposed sequentially, each by single whole-surface exposure, in accordance with a step-and-repeat method.

In a dual exposure procedure according to this embodiment, for exposure of each shot, initially, the exposure is performed with only a predetermined exposure amount $E_1$ in accordance with a first exposure condition. The conditions for the illumination system and the projection system under the first exposure condition are set by means of the exposure controller. The first exposure condition as well as a second exposure condition, to be described, are determined beforehand in accordance with the characteristic or feature of a pattern to be printed by the exposure. Namely, in this embodiment of the present invention, exposure amounts $E_1$ and $E_2$ for respective exposure conditions can be determined independently of each other, in accordance with a pattern to be printed.

The exposure amount is continuously monitored by the integrated exposure amount monitor 5. Plural threshold values can be set within this integrated exposure amount monitor and, additionally, the history of an actual exposure amount can be memorized in this monitor.

As the exposure amount, being detected, under the first exposure condition comes close to $E_1$, the illumination system closes its shutter to interrupt the exposure process. The exposure controller supplies a signal to the illumination system exposure condition setting means to change the stepper exposure condition to the second exposure condition. At this moment, the actual exposure amount under the first exposure condition is memorized. Any error $\Delta E_1$ of the thus memorized exposure amount with respect to the set value $E_1$ can be fed back, for the subsequent exposure.

In the second exposure condition, a different illumination system σ is set and a predetermined exposure amount $E_2$ is added. In accordance with the exposure control in this embodiment, the exposure amount is controlled so that the total exposure amount becomes equal to $E_1+E_2$. With this total exposure amount $E_1+E_2$ control, the exposure amount $E_2$ under the second exposure condition changes by an amount corresponding to the error $\Delta E_1$ in the first exposure condition. However, the amount of error in the total exposure amount can be reduced.

In an alternative example, the integrated exposure amount monitor may be reset before the exposure according to the second exposure condition, so that only $E_2$ may be controlled independently. With such $E_2$ independent control, the error in the total exposure amount may be large, but the error in the second exposure con di tion may be small.

Which one of the above-described two modes should be chosen may be determined in consideration of the image performance. In this embodiment, the exposure controller has a function for setting these two modes, and one of the two modes is selected in response to a mode selection to be made beforehand.

A second embodiment will be described with reference to an example wherein a multiple exposure procedure of the present invention is applied to a scan type exposure apparatus. Since it has a similar basic structure as described above, a description will be made again with reference to the block diagram of FIG. 2.

In a scan type exposure apparatus, the exposure condition cannot be changed during the scanning operation. Therefore, after completion of one scanning exposure, the exposure condition is changed and, then, the same exposure area is scanningly exposed again. In this case, the exposure amount $E_1$ during the first scan exposure may be memorized as $E_1(x)$ in relation to the scan position x. This enables correction of a total exposure amount, during the second scan exposure and any scan exposure following it.

Figure 4:
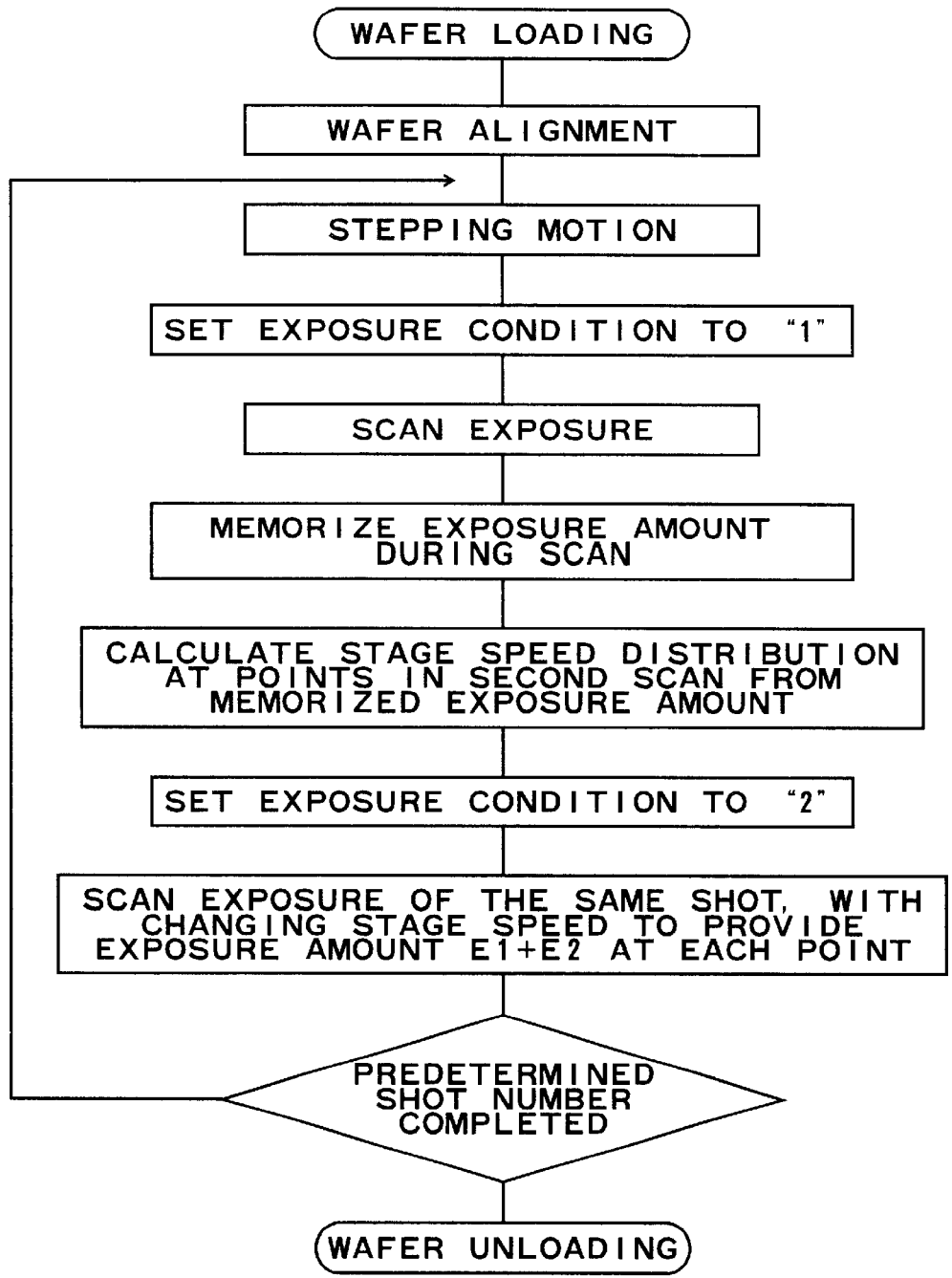
FIG. 4 is a flow chart of a multiple exposure procedure, in an example wherein the present invention is applied to a scanner (scan type).

The correction may be performed by adjusting the scanning movement speed of the stage, for example. FIG. 4 is a flow chart in an example based on the speed control.

Also, in the case of the scan type exposure apparatus, after loading a wafer onto the wafer stage, the wafer alignment is performed for positioning the same with respect to a reticle. Subsequently, the wafer is moved stepwise to a position where a shot to be exposed can be exposed. Then, the exposure apparatus is set for a first exposure operation under a first exposure condition, and scanning exposure is performed. During the first scanning exposure operation, exposure amounts at plural points within the shot are memorized.

Subsequently, the exposure controller operates to set the illumination system and projection system for a second exposure condition. Before starting the second scanning exposure operation according to the second exposure condition, a speed distribution or profile of the stage at respective points in the second scanning exposure operation is calculated on the basis of the exposure amounts having been memorized in connection with the first scanning exposure operation. In this embodiment, the speed profile is calculated on an assumption that the exposure energy supplied from the illumination system is constant.

The second scanning exposure to be made to the same shot is controlled so that the total exposure amount $E_1+E_2$ is constant over the whole shot, and dual exposure is performed in this manner. When dual exposure of the shot is completed, a stepping motion is made to the next shot position, and then a dual exposure procedure based on the first and second exposure conditions is similarly performed. If, in a simplest case, the exposure energy from the illumination system is constant and the scan is made at a constant speed, the second embodiment corresponds to a case where the scanning speed is changed between the first and second exposures.

An alternative of an exposure amount control method may be that, other than the stage speed, the exposure energy itself may be changed.

A third embodiment of the present invention will now be described. As compared with the first and second embodiments wherein changing the exposure condition is completed with respect to each shot and, while doing so, the whole wafer is exposed, in this embodiment, the whole wafer is first sequentially exposed in accordance with a first exposure condition and, then, the exposure condition is changed to a second exposure condition and again the whole wafer is sequentially exposed. A basic structure of this embodiment is like that of FIG. 2, and a description thereof will be omitted. The present embodiment is similarly applicable both to a stepper and a scan type exposure apparatus. This embodiment is particularly effective when the throughput is weighty and where the number of shots is not very large.

The third embodiment differs from the first and second embodiments in that, during the exposure under the first exposure condition and during the exposure under the second condition, the whole wafer surface is exposed, such that the relation between the reticle and the wafer, per shot, is not held fixed. In this embodiment, for this reason, the relative positional precision between a pattern to be formed under the first exposure condition and a pattern to be formed under the second exposure condition should be considered. In order to improve the positional precision of patterns to be printed in accordance with the first and second exposure conditions, wafer alignment may desirably be made again before the second exposure. If only the shift component is to be corrected by the second alignment operation, the number of measurement shots can be made smaller.

Figure 5:
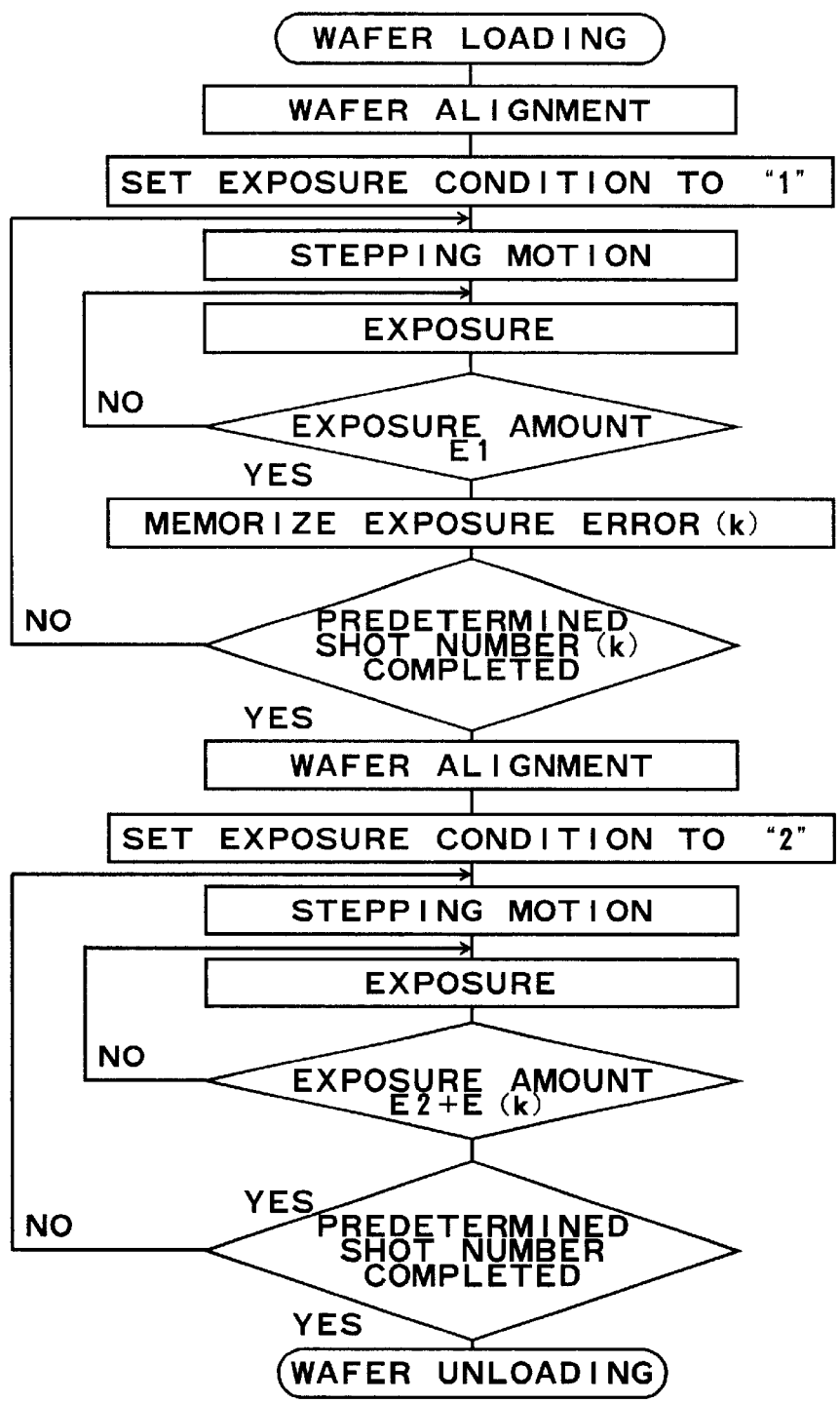
FIG. 5 is a flow chart of a multiple exposure procedure, in another example wherein the present invention is applied to a stepper.

FIG. 5 is a flow chart according to the third embodiment.

After a wafer is loaded into the exposure apparatus, wafer alignment for alignment with respect to a reticle is performed. Subsequently, the exposure controller of the exposure apparatus supplies signals to the exposure condition setting means for the illumination system and projection system, respectively, to set the illumination system and the projection system for a first exposure condition. As the preparation for the exposure operation according to the first exposure condition is completed, the wafer is moved stepwise to a predetermined exposure shot position, and exposure with an exposure amount $E_1$ is performed.

The exposure amount is continuously monitored by the integrated exposure amount monitor. As the exposure amount, being detected, comes close to $E_1$, the illumination system closes its shutter to interrupt the exposure process. When the exposure is interrupted, the total exposure amount is not always equal to $E_1$, and a certain exposure amount error may remain. The exposure amount error $E(k)$ for the k-th shot is memorized. It will be used as a correction value in the subsequent exposure operation to be done under a separate exposure condition. After the exposure error is memorized, the wafer is moved stepwise to the next shot position, and the exposure operation according to the first exposure condition is repeated. At the moment whereat exposures of a predetermined number of shots are just completed, exposure amount error components in the exposures of these shots have been memorized in relation to these shots.

When exposures of a predetermined number of shots are completed, the exposure apparatus operates to perform wafer alignment again. Subsequently, the exposure controller of the exposure apparatus supplies signals to the exposure condition setting means for the illumination system and projection system, respectively, to change the conditions for the illumination system and the projection system, whereby preparation for exposure according to the second exposure condition is completed. After the preparations are completed, the wafer is moved stepwise to the predetermined exposure shot position, and the exposure operation starts.

The exposure amount is monitored continuously by the integrated exposure amount monitor. The standard exposure amount under the second exposure condition is $E_2$. Since, however, the total exposure amount $E_1+E_2$ is controlled in this embodiment, the exposure amount for the k-th shot is determined, to correct the error component $E(k)$ in the first exposure condition, to provide $E_2+E(k)$. As the exposure amount in the second exposure condition, being detected, comes close to $E_2+E(k)$, the illumination system closes its shutter to finish the exposure process. By correcting the error in the first exposure condition through the exposure amount in the second exposure condition, the error in the total exposure amount can be made smaller.

Subsequently, the wafer is moved stepwise to the next shot position, and exposures according to the second exposure condition are repeated until the predetermined number of shots is reached.

In an alternative example, the integrated exposure amount monitor may be reset before the exposure according to the second exposure condition, so that only $E_2$ may be controlled independently. With such $E_2$ independent control, the error in the total exposure amount may be large, but the error in the second exposure condition may be small.

The first to third embodiments have been described with reference to an example using two exposure conditions. However, the present invention is not limited to exposures under two conditions. More exposures may be made in multiple superposition. For example, if exposures of a number n are to be made and where the exposure amount by the i-th exposure is Ei, errors in the exposure amount up to the (n−1)th exposure may be memorized and the n-th exposure amount En may be so controlled so that, finally, $$\Sigma E_i = E_1 + E_2 + \ldots + E_n$$

reaches the target exposure amount.

In accordance with the embodiments of the present invention as described hereinbefore, multiple exposure is performed while changing the conditions of the illumination system and numerical aperture NA of the projection optical system in accordance with the characteristic of the pattern to be printed. This enables improvement of the shape of the resist pattern to be formed. By applying the above-described multiple exposure method and exposure amount control method to a particular resist or resists or to a resist of a large thickness, exposure and development performance can be improved notably. Particularly, the taper of a resist after development becomes close to perpendicular, which is very advantageous for subsequent film formation processes, for example. Thus, the process performance in semiconductor device manufacture is improved significantly.

While the invention has been described with reference to the structures disclosed herein, it is not confined to the details set forth and this application is intended to cover such modifications or changes as may come within the purposes of the improvements or the scope of the following claims.

What is claimed is:

1. An exposure apparatus, comprising:
   a light source for emitting light;
   an illumination system for illuminating a pattern of a first object with light from said light source;
   a projection system for projecting the pattern, as illuminated, onto a second object loaded on a stage, wherein the same region on the second object to be exposed is exposed plural times through cooperation of said projection system and said illumination system; and
   changing means for performing the plural times exposures while changing an exposure condition such that the same region on the second object is exposed superposedly in a predetermined exposure time and under different exposure conditions, wherein said changing means changes at least one of a numerical aperture of said projection system and an illumination condition said illumination system, which illumination condition affects the shape of a resist pattern to be formed on a resist upon the second object.

2. An apparatus according to claim 1, further comprising setting means for setting exposure amounts for the plural times exposures, independently of each other.

3. An apparatus according to claim 2, further comprising memorizing means for memorizing an exposure amount in each of the plural times exposures, and exposure amount controlling means for performing exposure amount control on the basis of the memorization by said memorizing means so that a total exposure amount becomes constant.

4. An apparatus according to claim 2, further comprising a scanning mechanism for performing the plural times exposures on the basis of scan exposure, memorizing means for memorizing exposure amounts in the plural times exposures in relation to a position within the region to be exposed, and exposure amount controlling means for performing exposure amount control on the basis of the memorization by said memorizing means so that a total exposure amount becomes constant.

5. An apparatus according to claim 4, wherein said exposure amount controlling means performs the exposure amount control by controlling a scan speed of said scanning mechanism during exposure.

6. An apparatus according to claim 4, wherein said exposure amount controlling means performs exposure amount control by controlling exposure energy during exposure.

7. An apparatus according to claim 2, further comprising a moving mechanism for assisting in performing the plural times exposures for each of different regions on the second object while moving the second object stepwise, wherein said changing means assists in completing the plural times exposures in each region while changing the exposure condition.

8. An apparatus according to claim 2, further comprising a moving mechanism for assisting in performing the plural times exposures for each of different regions on the second object while moving the second object stepwise, wherein said changing means assists in performing exposures of the different regions under a predetermined exposure condition while the object is moved stepwise, and in changing the exposure condition thereafter.

9. An apparatus according to claim 8, further comprising detecting means for detecting relative position of the first and second objects as the exposure condition is changed by said changing means.

10. An exposure method, comprising the steps of:
illuminating a pattern of a first object with light from a light source and via an illumination system; and
projecting the pattern, as illuminated, onto a second object loaded on a stage, wherein the same region on the second object to be exposed is exposed plural times through cooperation of said projecting and illuminating steps, and the plural times exposures are performed while changing an exposure condition such that the same region on the second object is exposed superposedly in a predetermined exposure time and under different exposure conditions, the exposure condition including at least one of a numerical aperture in said projecting step and an illumination condition generated in said illuminating step, which illumination condition affects the shape of a resist pattern to be formed on a resist upon the second object.

11. A method according to claim 10, further comprising setting exposure amounts for the plural times exposures independently of each other.

12. A method according to claim 11, further comprising memorizing an exposure amount in each of the plural times exposures, and performing exposure amount control on the basis of the memorization so that a total exposure amount becomes constant.

13. A method according to claim 11, further comprising performing the plural times exposures on the basis of scan exposure, memorizing exposure amounts in the plural times exposures in relation to a position within the region to be exposed, and performing exposure amount control on the basis of the memorization so that a total exposure amount becomes constant.

14. A method according to claim 13, further comprising performing the exposure amount control by controlling a scan speed during exposure.

15. A method according to claim 13, further comprising performing the exposure amount control by controlling exposure energy during exposure.

16. A method according to claim 11, further comprising performing the plural times exposures for each of different regions on the second object while moving the second object stepwise, and completing the plural times exposures in each region while changing the exposure condition.

17. A method according to claim 11, further comprising performing the plural times exposures for each of different regions on the second object while moving the second object stepwise, performing exposures of the different regions under a predetermined exposure condition while moving the object stepwise, and changing the exposure condition thereafter.

18. A method according to claim 17, further comprising detecting a relative position of the first and second objects as the exposure condition is changed.

19. An exposure apparatus, comprising:
an illumination system for illuminating a pattern on a first object, said illumination system having a changeable illumination condition;
a projection system for projecting the pattern, as illuminated onto a second object loaded on a stage, said projection system having a changeable numerical aperature; and
a control system for controlling said illumination system and said projection system so that the same region on the second object to be exposed is exposed plural times, wherein the control system performs said plural times exposures while changing at least one of a numerical aperture of said projection system and an illumination condition generated by said illumination system such that the same region on the second object is exposed superposedly in a predetermined exposure time and under different exposure conditions, which illumination condition affects the shape of a resist pattern to be formed on a resist upon the second object.

20. An exposure method, comprising:
a first projection step for projecting a pattern of a first object, as illuminated with light from a light source and via an illumination system, onto a region on a second object loaded on a stage; and
a second projection step for projecting the pattern, as illuminated with light from the light source and via the illumination system, onto the region on the second object, wherein said second projection step is performed under a condition that at least one of a numerical aperture of the projection and an illumination condition generated by the illumination system, which illumination condition affects the shape of a resist pattern to be formed on a resist upon the second object, is made different from that in said first projection step, such that the same region on the second object is exposed superposedly in a predetermined exposure time and under different exposure conditions.

21. An exposure apparatus, comprising:
a light source for emitting light;
an illumination system for illuminating a pattern of a first object with light from said light source;
a projection system for projecting the pattern, as illuminated, onto a second object, wherein the same region on the second object to be exposed is exposed plural times through cooperation of said projection system and said illumination system; and
changing means for performing the plural-time exposures while changing an exposure condition such that the region on the second object is exposed superposedly under different exposure conditions, wherein said changing means changes at least one of a numerical aperture of said projection system and an illumination condition of said illumination system, which illumination condition is influential to the shape of a resist pattern to be formed upon the second object.

22. An exposure method, comprising the steps of:

illuminating a pattern of a first object with light from a light source and via an illumination system; and projecting the pattern, as illuminated, onto a second object, wherein the same region on the second object to be exposed is exposed plural times through cooperation of said projecting and illuminating steps, and the plural times exposures are performed while changing an exposure condition such that the same region on the second object is exposed superposedly under different exposure conditions, the exposure condition including at least one of a numerical aperture in said projecting step and an illumination condition generated in said illuminating step, which illumination condition is influential to the shape of a resist pattern to be formed upon the second object.

23. An exposure apparatus, comprising:

an illumination system for illuminating a pattern on a first object, said illumination system having a changeable illumination condition;

a projection system for projecting the pattern, as illuminated onto a second object, said projection system having a changeable numerical aperature; and a control system for controlling said illumination system and said projection system so that the same region on the second object to be exposed is exposed plural times, wherein the control system performs said plural times exposures while changing at least one of a numerical aperture of said projection system and an illumination condition generated by said illumination system such that the same region on the second object is exposed superposedly under different expsure conditions, which illumination condition is influential to the shape of a resist pattern to be formed upon the second object.

24. An exposure method, comprising:

a first projection step for projecting a pattern of a first object, as illuminated with light from a light source and via an illumination system, onto a region on a second object; and a second projection step for projecting the pattern, as illuminated with light from the light source and via the illumination system, onto the region on the second object, wherein said second projection step is performed under a condition that at least one of a numerical aperture of the projection and an illumination condition generated by the illumination system, which illumination condition is influential to the shape of a resist pattern to be formed upon the second object, is made different from that in said first projection step, such that the same region on the second object is exposed superposedly under different exposure conditions.

* * * * *

UNITED STATES PATENT AND TRADEMARK OFFICE
CERTIFICATE OF CORRECTION

PATENT NO.    : 6,473,158 B2
DATED         : October 29, 2002
INVENTOR(S)   : Shigeyuki Uzawa It is certified that error appears in the above-identified patent and that said Letters Patent is hereby corrected as shown below:

<u>Column 1,</u>
Line 22, "(1)" should read -- (1), --.

<u>Column 8,</u>
Line 44, after "object," this paragraph should end, and a new paragraph should begin on line 45 with "wherein".

Signed and Sealed this

First Day of July, 2003

JAMES E. ROGAN
*Director of the United States Patent and Trademark Office*